United States Patent
Sakuma et al.

(10) Patent No.: US 10,107,653 B2
(45) Date of Patent: *Oct. 23, 2018

(54) SENSOR DEVICE AND ELECTRONIC APPARATUS

(71) Applicant: Seiko Epson Corporation, Tokyo (JP)

(72) Inventors: Masayasu Sakuma, Kamiina (JP); Yoshihiro Kobayashi, Komagane (JP); Shojiro Kitamura, Suwa (JP); Taketo Chino, Hokuto (JP)

(73) Assignee: Seiko Epson Corporation (JP)

( * ) Notice: Subject to any disclaimer, the term of this patent is extended or adjusted under 35 U.S.C. 154(b) by 477 days.

This patent is subject to a terminal disclaimer.

(21) Appl. No.: 14/596,853

(22) Filed: Jan. 14, 2015

(65) Prior Publication Data

US 2015/0122020 A1    May 7, 2015

Related U.S. Application Data

(63) Continuation of application No. 13/545,075, filed on Jul. 10, 2012, now Pat. No. 8,960,000.

(30) Foreign Application Priority Data

Jul. 13, 2011  (JP) .................................. 2011-154502

(51) Int. Cl.
*G01D 11/24* (2006.01)
*G01C 19/5769* (2012.01)
*G01C 21/16* (2006.01)
*G01D 11/30* (2006.01)

(52) U.S. Cl.
CPC ....... *G01D 11/245* (2013.01); *G01C 19/5769* (2013.01); *G01C 21/16* (2013.01); *G01D 11/30* (2013.01)

(58) Field of Classification Search
CPC .................................................... G01D 11/245
See application file for complete search history.

(56) References Cited

U.S. PATENT DOCUMENTS

| | | | |
|---|---|---|---|
| 4,656,750 A * | 4/1987 | Pitt ........................ | G01C 17/26 324/247 |
| 5,265,471 A | 11/1993 | Kawauchi et al. | |
| 5,331,854 A | 7/1994 | Hulsing, II | |
| 5,542,296 A * | 8/1996 | Reidemeister .......... | G01P 1/023 361/280 |
| 6,216,537 B1 | 4/2001 | Henschel et al. | |
| 6,568,267 B2 | 5/2003 | Chida et al. | |
| 6,738,721 B1 | 5/2004 | Drucke et al. | |

(Continued)

FOREIGN PATENT DOCUMENTS

| | | |
|---|---|---|
| EP | 1674825 A1 | 6/2006 |
| JP | 05-340960 A | 12/1993 |

(Continued)

*Primary Examiner* — Lisa Caputo
*Assistant Examiner* — Herbert K Roberts
(74) *Attorney, Agent, or Firm* — Harness, Dickey & Pierce, P.L.C.

(57) ABSTRACT

A sensor device includes a mounting member having fixation surfaces inside, and at least one electronic component directly or indirectly fixed to the fixation surfaces of the mounting member, and the mounting member constitutes a part of a casing for housing the electronic component. Further, the fixation surfaces are perpendicular to each other.

8 Claims, 9 Drawing Sheets

(56) References Cited

U.S. PATENT DOCUMENTS

| | | |
|---|---|---|
| 7,040,922 B2 | 5/2006 | Harney et al. |
| 7,091,474 B2 | 8/2006 | Sano |
| 7,987,713 B2 | 8/2011 | Ota et al. |
| 2001/0013251 A1* | 8/2001 | Fujimoto ............ G01C 19/5663 73/504.04 |
| 2009/0255335 A1* | 10/2009 | Fly .................... G01C 19/5719 73/493 |
| 2011/0210408 A1 | 9/2011 | Otsuki |

FOREIGN PATENT DOCUMENTS

| | | | |
|---|---|---|---|
| JP | 07-306047 A | | 11/1995 |
| JP | 11-211481 A | | 8/1999 |
| JP | 11-289141 A | | 10/1999 |
| JP | 2001-102746 A | | 4/2001 |
| JP | 2002-009228 A | | 1/2002 |
| JP | 2005-197493 A | | 7/2005 |
| JP | 2006-337196 A | | 12/2006 |
| JP | 2006337196 A | * | 12/2006 |
| JP | 2008224428 A | | 9/2008 |
| JP | 2011-516898 A | | 5/2011 |
| WO | WO-2008003664 A1 | | 1/2008 |
| WO | WO-2009-129066 A2 | | 10/2009 |

* cited by examiner

SENSOR DEVICE AND ELECTRONIC APPARATUS

CROSS-REFERENCE TO RELATED APPLICATIONS

This is a continuation patent application of U.S. application Ser. No. 13/545,075 filed Jul. 10, 2012, which claims priority to Japanese Patent Application No. 2011-154502, filed Jul. 13, 2011, all of which are expressly incorporated by reference herein in their entireties.

BACKGROUND

1. Technical Field

The present invention relates to a sensor device and an electronic apparatus.

2. Related Art

There is known such a sensor unit (sensor device) as disclosed in, for example, U.S. Pat. No. 7,040,922 (Document 1). The sensor unit described in Document 1 has a mounting member having a cuboid shape and three surfaces perpendicular to each other, and sensor devices mounted respectively on the three surfaces.

In the case of mounting such sensor devices on a circuit board or the like, it is difficult to mount the sensor devices directly on the circuit board, and the sensor devices are generally mounted in a condition of being housed in a casing composed of a pedestal and a lid member. However, if the sensor devices are housed in such a casing, there arises a problem of growth in size of the sensor devices. Further, if the sensor devices are fixed obliquely to the casing, there also arises a problem that the detection axes of the sensor devices are tilted to thereby degrade the detection accuracy. Therefore, the sensor devices downsizing of which can be achieved, and positioning of which is performed correctly have eagerly been desired.

SUMMARY

An advantage of the invention is to provide a sensor device and an electronic apparatus with which positioning of a sensor component can be performed with ease and accuracy while achieving downsizing.

An aspect of the invention is directed to a sensor device including a mounting member having a space formed inside, and a fixation surface exposed to the space, and a plurality of electronic components including a plurality of sensor components and fixed on the fixation surface side of the mounting member, the sensor components have respective detection axes intersecting with each other, and the mounting member constitutes a part of a casing housing the electronic components.

According to this configuration, it is possible to provide a sensor device with which positioning of a sensor component can be performed with ease and accuracy while achieving downsizing.

In the sensor device of the above aspect of the invention, it is preferable that the mounting member has amain body and a recessed section opened in an outer peripheral surface of the main body.

According to this configuration, the configuration of the mounting member becomes simple.

In the sensor device of the above aspect of the invention, it is preferable that the fixation surface includes at least a first fixation surface, a second fixation surface, and a third fixation surface intersecting with each other, and the sensor components are fixed respectively on the first fixation surface side, the second fixation surface side, and the third fixation surface side.

According to this configuration, the sensor device capable of detecting physical quantities around respective three axes intersecting with each other can be obtained.

In the sensor device of the above aspect of the invention, it is preferable that the casing has the mounting member, and a lid member mounted above the recessed section of the mounting member.

According to this configuration, infiltration of dust or the like into the casing can be prevented.

In the sensor device of the above aspect of the invention, it is preferable that the mounting member has a main body and a through hole penetrating the main body.

According to this configuration, the configuration of the mounting member becomes simple.

In the sensor device of the above aspect of the invention, it is preferable that the fixation surface includes a first fixation surface and a second fixation surface intersecting with each other.

According to this configuration, the detection axes of the sensor components can be made perpendicular to each other.

In the sensor device of the above aspect of the invention, it is preferable that the casing includes a first lid member adapted to cover one opening of the through hole, and a second lid member adapted to cover the other opening.

According to this configuration, infiltration of dust or the like into the casing can be prevented.

In the sensor device of the above aspect of the invention, it is preferable that an inner surface of the first lid member exposed to the through hole intersects with the first fixation surface and the second fixation surface.

According to this configuration, it is possible to fix the sensor component also to the inner surface, and the freedom of arrangement of the sensor components is enhanced.

In the sensor device of the above aspect of the invention, it is preferable that the fixation surface has a recessed section, and the sensor component is housed in the recessed section.

According to this configuration, it is possible to effectively use the space of the mounting member to thereby achieve the downsizing of the sensor device.

In the sensor device of the above aspect of the invention, it is preferable that the sensor components are mounted on a mounting board, the mounting board includes a plurality of boards on which the electronic components are mounted, and the plurality of boards are bendable between the boards.

According to this configuration, the fixation of the sensor components to the fixation surfaces becomes easy.

Another aspect of the invention is directed to an electronic apparatus including any of the sensor devices described above.

According to this configuration, an electronic apparatus capable of exerting excellent reliability can be obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a sensor device and an electronic apparatus according to the invention will be explained in detail based on some exemplary embodiments shown in the accompanying drawings.

1. Sensor Device

First Embodiment

Firstly, a sensor device according to a first embodiment of the invention will be explained.

Figure 1:
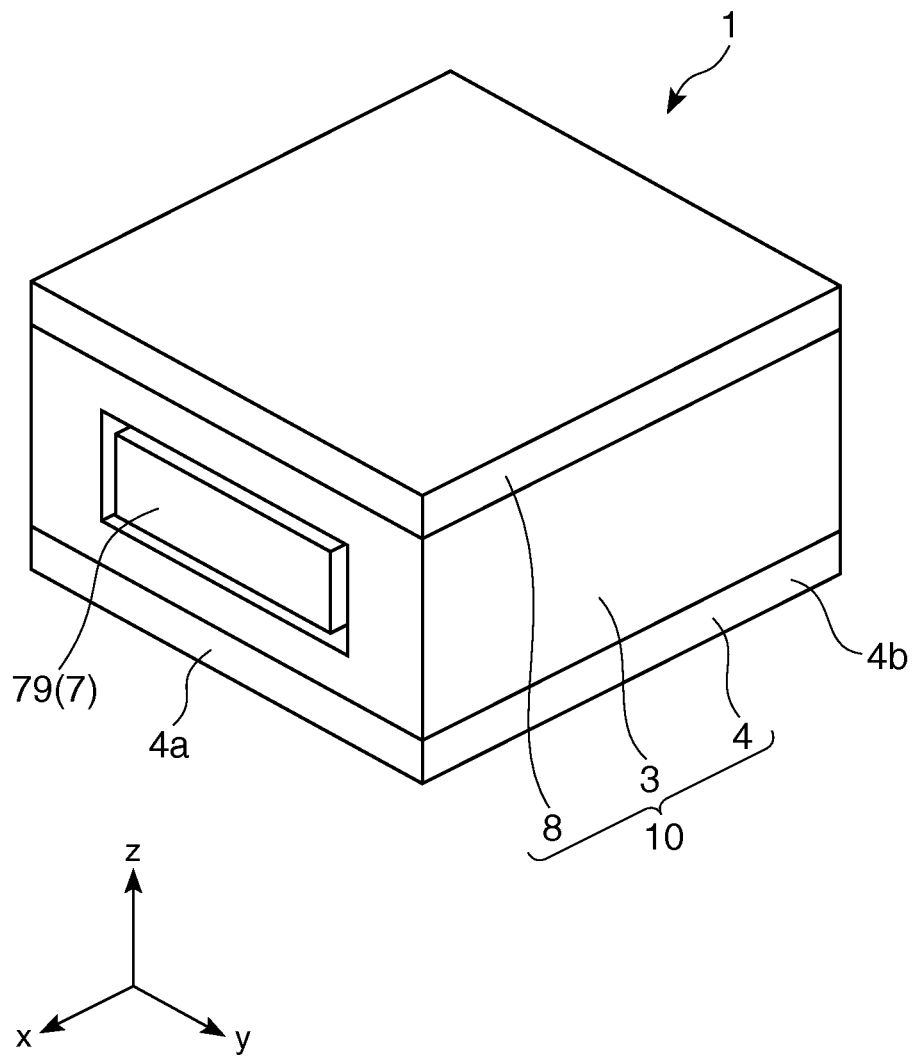
FIG. 1 is a perspective view showing a sensor device according to a first embodiment of the invention.
Figure 2:
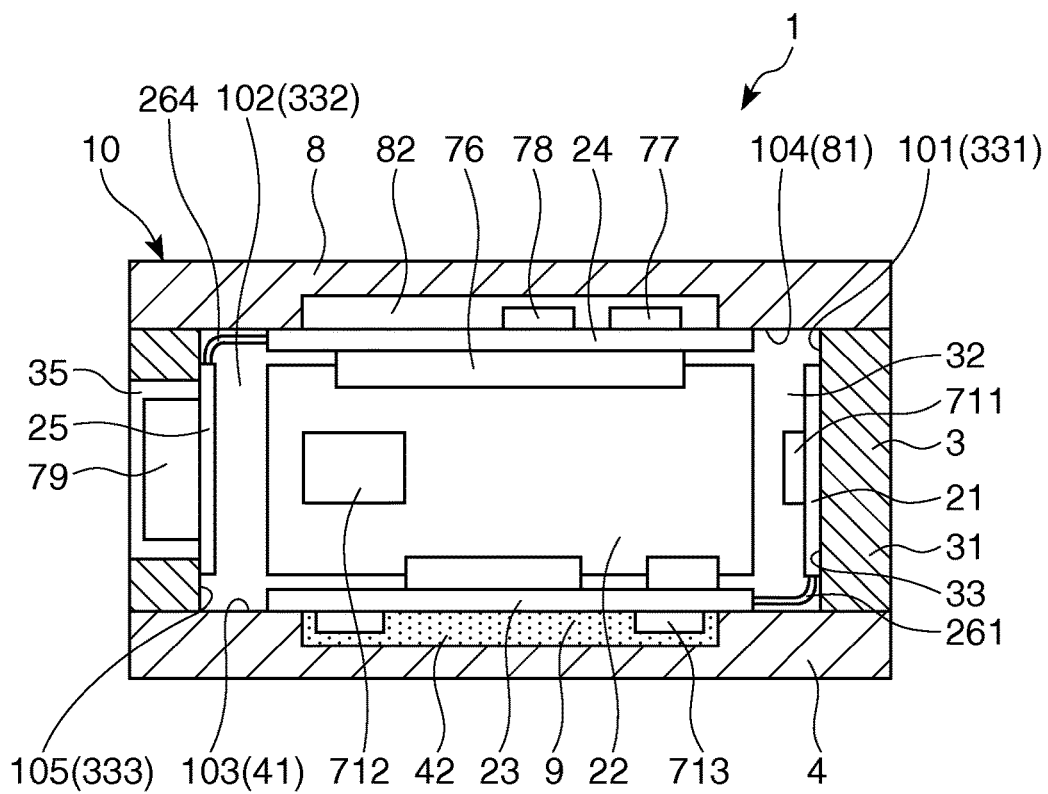
FIG. 2 is a cross-sectional view of the sensor device shown in FIG. 1.
Figure 2:
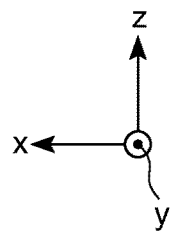
Figure 3A:
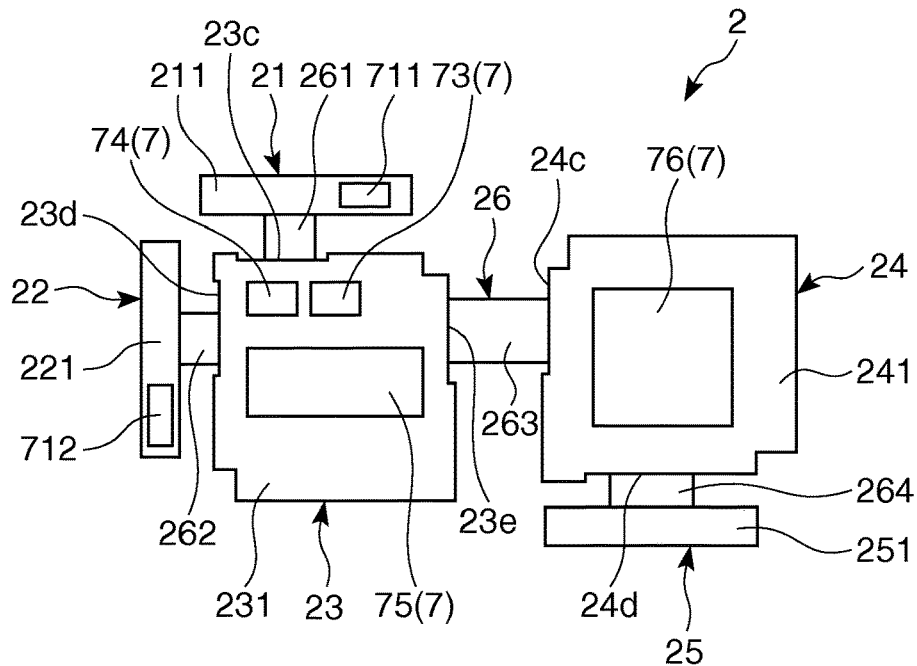
FIGS. 3A and 3B are development diagrams of a mounting board provided to the sensor device shown in FIG. 1.
Figure 3B:
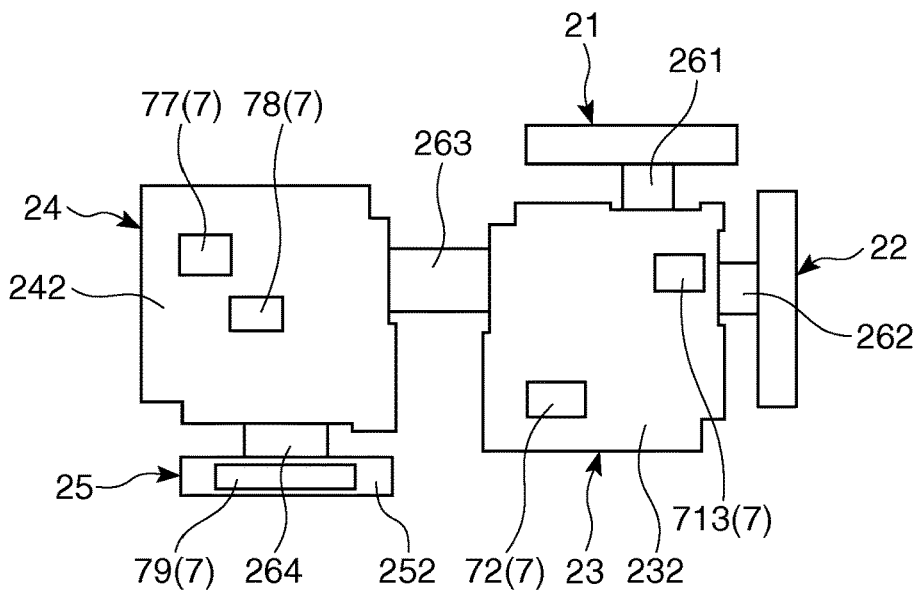
Figure 4:
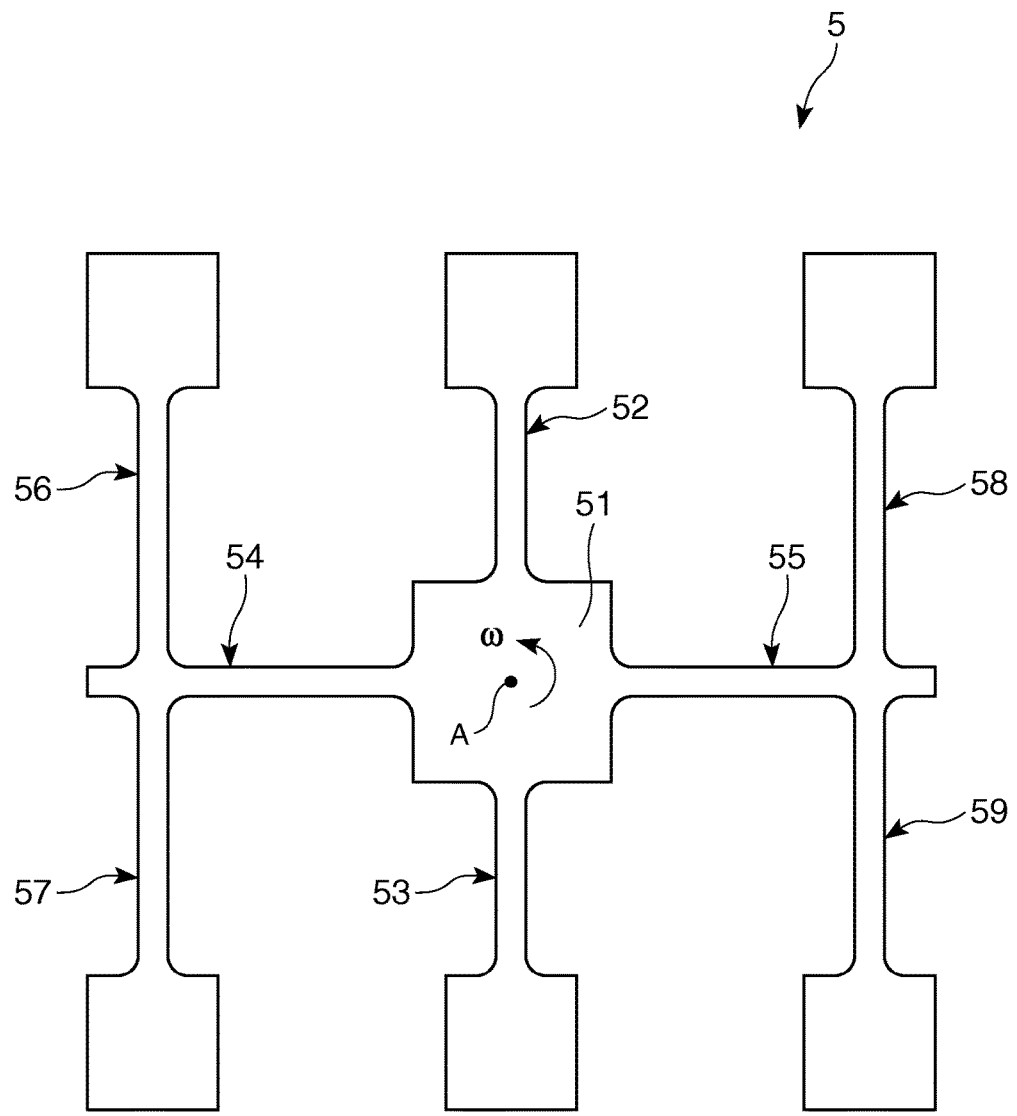
FIG. 4 is a plan view showing an example of an angular velocity sensor provided to the sensor device shown in FIG. 1.

FIG. 1 is a perspective view showing the sensor device according to the first embodiment of the invention, FIG. 2 is a cross-sectional view of the sensor device shown in FIG. 1, FIGS. 3A and 3B are development diagrams of a mounting board provided to the sensor device shown in FIG. 1, and FIG. 4 is a plan view showing an example of an angular velocity sensor provided to the sensor device shown in FIG. 1. It should be noted that the explanation will hereinafter be presented defining the upper side of FIG. 1 as the "upper side" and the lower side thereof as the "lower side" for the sake of convenience of explanation. Further, as shown in FIG. 1, three axes perpendicular to each other are defined as an "x axis," a "y axis," and a "z axis," respectively. The z axis is an axis parallel to the thickness direction of a pedestal 4, the x axis is an axis parallel to the extending direction of a pair of sides of the pedestal opposed to each other, and the y axis is an axis parallel to the extending direction of the other pair of sides of the pedestal opposed to each other.

Further, hereinafter, the direction parallel to the x axis is defined as an "x-axis direction," the direction parallel to the y axis is defined as a "y-axis direction," and the direction parallel to the z axis is defined as a "z-axis direction." Further, a plane including the x axis and the y axis is defined as an "x-y plane," a plane including the y axis and the z axis is defined as a "y-z plane," and a plane including the z axis and the x axis is defined as a "x-z plane."

A sensor device 1 is a three-axis gyro sensor device provided with angular velocity sensors 711, 712, and 713, and capable of detecting angular velocities around the x axis, the y axis, and the z axis perpendicular to each other, respectively. Such a sensor device 1 as described above is superior in convenience, and can preferably be used, for example, for motion trace, motion tracking, a motion controller, and pedestrian dead reckoning (PDR).

As shown in FIGS. 1 and 2, such a sensor device 1 as described above has a mounting board 2 on which electronic components 7 are mounted, and a casing 10 for housing the mounting board 2. Hereinafter, each of these members will sequentially be explained.

Mounting Board 2

The mounting board 2 is a rigid-flexible board obtained by combining rigid boards (substrates) hard and difficult to be deformed, and flexible boards soft, easy to be deformed, and provided with flexibility. The mounting board 2 is arranged to be able to be bent in portions between the rigid boards. As such a mounting board 2 as described above, there can be used a rigid-flexible board known to the public, for example, those having hard layers such as glass epoxy boards bonded to both sides of the flexible board, and using these parts as the rigid boards.

FIG. 3A is a plan view of the mounting board 2 in a developed state viewed from one surface side, and FIG. 3B is a plan view of the mounting board 2 in the developed state viewed from the other surface side. As shown in FIGS. 3A and 3B, the mounting board 2 is composed of a first rigid board 21, a second rigid board 22, a third rigid board 23, a fourth rigid board 24, and a fifth rigid board 25 disposed away from each other, and a flexible board 26 for connecting these rigid boards.

It should be noted that hereinafter surfaces of the rigid boards 21 through 25 shown in FIG. 3A are referred to as "obverse-side mounting surfaces," and surfaces shown in FIG. 3B are referred to as "reverse-side mounting surfaces" for the sake of convenience of explanation.

The flexible board 26 has a first connection section 261 for connecting the first rigid board 21 and the third rigid board 23, a second connection section 262 for connecting the second rigid board 22 and the third rigid board 23, a third connection section 263 for connecting the third rigid board 23 and the fourth rigid board 24, and a fourth connection section 264 for connecting the fourth rigid board 24 and the fifth rigid board 25. Each of the connection sections 261 through 264 has flexibility, and therefore easily makes bending deformation in the surface direction.

The mounting board 2 is capable of changing the posture of the rigid boards 21 through 25 by bending the connection sections 261 through 264 of the flexible board 26. Specifically, by bending the connection sections 261 through 264 so that obverse side mounting surfaces 211 through 251 of the respective rigid boards 21 through 25 face inward, the mounting board 2 can be deformed to have a cuboid shape in which the rigid boards adjacent to each other are perpendicular to each other. In this state, assuming that the third rigid board 23 forms a lower surface, the fourth rigid board 24 forms an upper surface, and the first, second, and fifth rigid boards 21, 22, and 25 respectively form side surfaces.

As described above, by constituting the mounting board 2 with the rigid-flexible board, it is possible to easily deform the mounting board 2, and therefore, it becomes easy to fix the mounting board 2 to a mounting member 3. Further, since the rigid boards 21 through 25 are connected to each other in a lump by the connection sections 261 through 264, also in this regard, the fixation of the mounting board 2 to the mounting member 3 can be performed easily and smoothly. Further, since a plurality of rigid boards are provided, freedom of arrangement of the electronic components 7 increases.

Further, by mounting the electronic components 7 on the hard rigid board, unwanted vibration of the electronic components 7 (in particular the angular velocity sensors 711 through 713, an acceleration sensor 72) can be suppressed, and thus the detection accuracy of the sensor device 1 is improved. Further, the electronic components 7 are easy to be mounted on the mounting board 2. Still further, the parallelism of the electronic components 7 can easily be achieved, and in particular, the angular velocity sensors 711 through 713 can easily be set to have desired postures, and the postures can be kept. Further, the electronic components 7 can also be mounted at high density.

Here, in the present embodiment, the third rigid board 23 has a cutout section 23c, a cutout section 23d, and a cutout section 23e each opened in an edge (an outer periphery) thereof. The cutout section 23c is formed to have a step with respect to the upper side of the third rigid board 23 in FIG. 3A, and the first connection section 261 extends from the cutout section 23c. Further, the cutout section 23d is formed to have a step with respect to the left side of the third rigid board 23 in FIG. 3A, and the second connection section 262 extends from the cutout section 23d. Further, the cutout section 23e is formed to have a step with respect to the right side of the third rigid board 23 in FIG. 3A, and the third connection section 263 extends from the cutout section 23e.

By providing the cutout section 23c to the third rigid board 23, it is possible to easily make the first connection section 261 have the bending deformation in the vicinity of (on the third rigid board 23 side of) a connection portion with the third rigid board 23, and further, the curvature radius of the bending deformation can be kept relatively large. Further, excessive projection of the first connection section 261 is prevented, and thus downsizing of the sensor device 1 can be achieved. Substantially the same advantage can be achieved with respect to the cutout sections 23d, 23e.

Further, in the present embodiment, the fourth rigid board 24 has a cutout section 24c, and a cutout section 24d each opened in an edge (an outer periphery) thereof. The cutout section 24c is formed to have a step with respect to the left side of the fourth rigid board 24 in FIG. 3A, and the third connection section 263 extends from the cutout section 24c. Similarly, the cutout section 24d is formed to have a step with respect to the lower side of the fourth rigid board 24 in FIG. 3A, and the fourth connection section 264 extends from the cutout section 24d.

By providing the cutout section 24c to the fourth rigid board 24, it is possible to easily make the third connection section 263 have the bending deformation in the vicinity of (on the fourth rigid board 24 side of) a connection portion with the fourth rigid board 24, and further, the curvature radius of the bending deformation can be kept relatively large. Further, excessive projection of a bent portion from the outer periphery of the fourth rigid board 24 is prevented, and thus downsizing of the sensor device 1 can be achieved. Substantially the same advantage can be achieved with respect to the cutout section 24d.

The mounting board 2 is hereinabove explained. It should be noted that each of the rigid boards 21 through 25, and the flexible board 26 of the mounting board 2 is provided with conductor patterns not shown, and the plurality of electronic components 7 are electrically connected in an appropriate manner via the conductor patterns.

Further, the mounting board 2 is provided with a ground layer not shown, and the ground layer exerts a function of blocking an external magnetic field. Therefore, in the condition of being fixed to the casing 10, it is possible to eliminate the influence of the external magnetic field (external noise) from the outside of the sensor device 1 with respect to the electronic components 7 (i.e., the electronic components 7 mounted on the obverse side mounting surfaces 211 through 251) located inside the mounting board 2.

Electronic Components 7

As shown in FIGS. 3A and 3B, on the mounting board 2, there is mounted the plurality of electronic components 7.

On the mounting board 2, there are mounted as the electronic components 7 three angular velocity sensors (sensor components) 711 through 713 of a uniaxial detection type, the acceleration sensor (a sensor component) 72 of a triaxial detection type, a power supply circuit 73 for driving a variety of electronic components, an amplifier circuit 74 for amplifying output signals from the sensor components 711 through 713, and 72, an analog/digital converter circuit 75 for converting analog signals thus amplified by the amplifier circuit 74 into digital signals, a microcontroller 76 for performing desired control, a nonvolatile memory 77 such as an EEPROM, a direction sensor (a magnetic sensor) 78 for detecting the direction, and a connector (an interface connector) 79 for outputting signals. It should be noted that the electronic components 7 to be mounted thereon are not limited thereto, but it is possible to arbitrarily mount any components corresponding to the purpose.

Hereinafter, the arrangement of the electronic components 7 will be described in detail.

First Rigid Board 21

On the obverse side mounting surface 211 of the first rigid board 21, there is mounted the angular velocity sensor 711.

Second Rigid Board 22

On the obverse side mounting surface 221 of the second rigid board 22, there is mounted the angular velocity sensor 712.

Third Rigid Board 23

On the obverse side mounting surface 231 of the third rigid board 23, there are mounted the power supply circuit 73, the amplifier circuit 74, and the analog/digital converter circuit 75, and on a reverse side mounting surface 232, there are mounted the angular velocity sensor 713 and the acceleration sensor 72.

The analog/digital converter circuit 75 is larger in size than the other electronic components 7 (the power supply circuit 73 and the amplifier circuit 74) mounted on the obverse side mounting surface 231. Therefore, it is preferable to dispose the analog/digital converter circuit 75 at a center portion of the obverse side mounting surface 231. Thus, it is possible to effectively use the analog/digital converter circuit 75 as a reinforcement member for reinforcing the rigidity of the third rigid board 23. Therefore, the unwanted vibration due to the flexural deformation of the third rigid board 23 can be suppressed, the unwanted vibration can be prevented from being transmitted to the angular velocity sensors 711 through 713, and therefore the accuracy of the detection of the angular velocity by the angular velocity sensors 711 through 713 (in particular the angular velocity sensor 713 mounted on the third rigid board 23) is improved.

Further, the angular velocity sensor 713 and the acceleration sensor 72 are preferably disposed in the vicinity of an edge portion of the obverse side mounting surface 231. As described later, the third rigid board 23 is fixed to the pedestal 4 at the edge portion thereof via an adhesive. Therefore, it is hard for the edge portion of the third rigid board 23 to be deformed, and therefore the unwanted vibration is difficult to occur. Therefore, by disposing the angular velocity sensor 713 and the acceleration sensor 72 at such places, the angular velocity and the acceleration can more accurately be detected.

Further, by mounting the angular velocity sensor 713 and the acceleration sensor 72 on the reverse side mounting surface 232, it is possible to elongate the distance from the microcontroller 76 in the condition in which the mounting board 2 is fixed to the casing 10. Further, it is possible to make the ground layer provided to the third rigid board 23 be located between the angular velocity sensor 713 and the acceleration sensor 72, and the microcontroller 76. Therefore, it is possible to prevent radiation noise generated from the microcontroller 76 from exerting a harmful influence on the angular velocity sensor 713 and the acceleration sensor 72 to thereby improve the detection accuracy of the angular velocity sensor 713 and the acceleration sensor 72.

Fourth Rigid Board 24

On the obverse side mounting surface 241 of the fourth rigid board 24, there is mounted the microcontroller 76, and on a reverse side mounting surface 242, there are mounted the nonvolatile memory 77 and the direction sensor 78.

The microcontroller 76 is larger in size than the other electronic components 7 (the nonvolatile memory 77 and the direction sensor 78) mounted on the fourth rigid board 24. Therefore, it is preferable to dispose the microcontroller 76 at a center portion of the obverse side mounting surface 241. Thus, it is possible to effectively use the microcontroller 76 as a reinforcement member for reinforcing the rigidity of the fourth rigid board 24. Therefore, the unwanted vibration due to the flexural deformation of the fourth rigid board 24 can be suppressed, and the unwanted vibration can be prevented from being transmitted to the angular velocity sensors 711 through 713, and therefore the accuracy of the detection of the angular velocity by the angular velocity sensors 711 through 713 is improved.

Further, by mounting the direction sensor 78 on the mounting surface opposite to the surface on which the microcontroller 76 is mounted, the radiation noise generated from the microcontroller 76 can be blocked by the ground layer of the fourth rigid board 24, and therefore, the radiation noise (the magnetic field) can effectively be prevented from exerting a harmful influence on the direction sensor 78. Therefore, the detection accuracy of the direction sensor 78 can be improved.

Fifth Rigid Board 25

On a reverse side mounting surface 252 of the fifth rigid board 25, there is mounted the connector 79.

Hereinabove, the arrangement of the electronic components 7 is described in detail.

In the mounting board 2, an analog circuit composed of the power supply circuit 73, the amplifier circuit 74, the analog/digital converter circuit 75, and so on is provided to the third rigid board 23, and a digital circuit composed of the microcontroller 76, the nonvolatile memory 77, and so on is provided to the fourth rigid board 24. By forming the analog circuit and the digital circuit on the respective rigid boards separated from each other as described above, the generation and the transmission of the noise can effectively be suppressed, and thus the detection accuracy of the sensor device 1 is further enhanced.

The angular velocity sensors 711 through 713 are not particularly limited providing the angular velocity can be detected, and known uniaxial detection type of angular velocity sensors can be used therefor. As such angular velocity sensors 711 through 713, a sensor having a vibrator element 5 shown in FIG. 4, for example, can be used.

The vibrator element 5 is made of a quartz crystal (a piezoelectric material). Further, the vibrator element 5 has a base section 51, a pair of detecting vibrator arms 52, 53 extending in a vertical direction of a sheet of the drawing from both sides of the base section 51, a pair of connection arms 54, 55 extending in a lateral direction of the sheet from both sides of the base section 51, and pairs of driving vibrator arms 56, 57, 58, and 59 extending in the vertical direction of the sheet from both sides of respective tip portions of the connection arms 54, 55. Further, a surface of each of the detecting vibrator arms 52, 53 is provided with a detecting electrode (not shown), and a surface of each of the driving vibrator arms 56, 57, 58, and 59 is provided with a driving electrode (not shown).

In such a vibrator element 5, in the condition in which the driving vibrator arms 56, 58 and the driving vibrator arms 57, 59 are made to vibrate by applying a voltage to the driving electrodes so as to repeat to come closer to and get away from each other, when an angular velocity ω around a normal line A (a detection axis A) of the vibrator element 5 is applied, the Coriolis force is applied to the vibrator element 5, and the vibration of the detecting vibrator arms 52, 53 is excited. Then, by detecting the distortion in the detecting vibrator arms 52, 53, which is caused by the vibration of the detecting vibrator arms 52, 53, by the detecting electrodes, the angular velocity applied to the vibrator element 5 can be obtained.

The angular velocity sensors 711 through 713 each having the configuration described above are mounted on the first through third rigid boards 21 through 23, respectively, so that the thickness direction of the rigid board corresponds to the detection axis.

Casing

As shown in FIG. 2, the casing 10 has the mounting member 3, the pedestal (a first lid member) 4, and a lid member (a second lid member) 8. In other words, the mounting member 3 constitutes a part of the casing 10. Since the number of components of the sensor device 1 can be reduced by using the mounting member 3 as the part of the casing as described above, the downsizing of the sensor device 1 can be achieved.

Such a casing 10 as described above has a fixation surface (a first fixation surface) 101 for fixing the first rigid board 21, a fixation surface (a second fixation surface) 102 for fixing the second rigid board 22, a fixation surface (a third fixation surface) 103 for fixing the third rigid board 23, a fixation surface (a fourth fixation surface) 104 for fixing the fourth rigid board 24, and a fixation surface (a fifth fixation surface) 105 for fixing the fifth rigid board 25.

Hereinafter, the mounting member 3, the pedestal 4, and the lid member 8 will sequentially be explained.

Mounting Member

As shown in FIG. 2, the mounting member 3 has a main body 31, and a through hole 32 opened in an upper surface and a lower surface of the main body 31. A space in the through hole 32 functions as a housing space for housing the electronic components 7.

In the present embodiment, the outer shape of the main body 31 in the x-y plan view is a rectangle. Further, the upper surface and the lower surface are both planes parallel to the x-y plane. Further, the through hole 32 extends in the z-axis direction and has a roughly rectangular lateral cross-sectional shape.

An inner surface 33 exposed to the through hole 32 is composed of a pair of planes 331, 333 parallel to the y-z plane and a pair of planes 332, 334 parallel to the x-z plane. Among these four planes 331 through 334, the plane 331 constitutes the fixation surface 101, the plane 332 constitutes the fixation surface 102, and the plane 333 constitutes the fixation surface 105.

As shown in FIG. 2, to the fixation surface 101, there is fixed the first rigid board 21 with the reverse side mounting surface 212 facing the fixation surface 101. Thus, the angular velocity sensor 711 is fixed indirectly to the fixation surface 101 via the first rigid board 21. Since the fixation surface 101 is the plane parallel to the y-z plane as described above, in the state in which the first rigid board 21 is fixed to the fixation surface 101, the detection axis of the angular velocity sensor 711 becomes parallel to the x axis. As described above, only by fixing the first rigid board 21 to the fixation surface 101, positioning of the angular velocity sensor 711 with respect to the casing 10 can easily be performed.

Further, by locating the angular velocity sensor 711 on the inner side of the first rigid board 21, the external magnetic field can be blocked by the ground layer provided to the first rigid board 21, and therefore, the influence of the external magnetic field is reduced, and thus the detection accuracy of the angular velocity sensor 711 is improved.

Although the method of fixing the first rigid board 21 to the fixation surface 101 is not particularly limited, it is preferable to use both of fixation with an adhesive and fixation with screws. Thus, the fixation of the first rigid board 21 to the fixation surface 101 can surely be performed. Further, since a layer of the adhesive intervenes between the mounting member 3 and the first rigid board 21, the adhesive absorbs and eases the vibration transmitted from the mounting member 3 to thereby suppress the unwanted vibration of the first rigid board 21. As a result, the detection accuracy of the sensor device 1 is further improved.

As shown in FIG. 2, to the fixation surface 102, there is fixed the second rigid board 22 with a reverse side mounting surface 222 facing the fixation surface 102. Thus, the angular velocity sensor 712 is fixed indirectly to the fixation surface 102 via the second rigid board 22. Since the fixation surface 102 is the plane parallel to the x-z plane as described above, in the state in which the second rigid board 22 is fixed to the fixation surface 102, the detection axis of the angular velocity sensor 712 becomes parallel to the y axis. As described above, only by fixing the second rigid board 22 to the fixation surface 102, positioning of the angular velocity sensor 712 with respect to the casing 10 can easily be performed.

Further, by locating the angular velocity sensor 712 on the inner side of the second rigid board 22, the external magnetic field can be blocked by the ground layer provided to the second rigid board 22, and therefore, the influence of the external magnetic field is reduced, and thus the detection accuracy of the angular velocity sensor 712 is improved.

Although the method of fixing the second rigid board 22 to the fixation surface 102 is not particularly limited, it is preferable to use both of fixation with an adhesive and fixation with screws. Thus, the fixation of the second rigid board 22 to the fixation surface 102 can surely be performed. Further, since a layer of the adhesive intervenes between the mounting member 3 and the second rigid board 22, the adhesive absorbs and eases the vibration transmitted from the mounting member 3 to thereby suppress the unwanted vibration of the second rigid board 22. As a result, the detection accuracy of the sensor device 1 is further improved.

As shown in FIG. 2, to the fixation surface 105, there is fixed the fifth rigid board 25 with the reverse side mounting surface 252 facing the fixation surface 105. Further, the mounting member 3 is provided with a through hole 35 penetrating the fixation surface 105 and an outer peripheral surface, and the fifth rigid board 25 is fixed to the fixation surface 105 with the connector 79 inserted in the through hole 35. Thus, the connector 79 is exposed to the outside of the sensor device 1 via the through hole 35, and an output of signals from the sensor device 1 can easily be achieved. It should be noted that it is preferable for the fifth rigid board 25 to be fixed to the fixation surface 105 so as to cover an opening of the through hole 35. Thus, infiltration of dust and so on into the casing can be prevented to thereby keep the reliability of the sensor device 1.

Although the method of fixing the fifth rigid board 25 to the fixation surface 105 is not particularly limited, it is preferable to use both of fixation with an adhesive and fixation with screws. Thus, the fixation of the fifth rigid board 25 to the fixation surface 105 can surely be performed. Further, since a layer of the adhesive intervenes between the mounting member 3 and the fifth rigid board 25, the adhesive absorbs and eases the vibration transmitted from the mounting member 3 to thereby suppress the unwanted vibration of the fifth rigid board 25. As a result, the detection accuracy of the sensor device 1 is further improved.

Although a constituent material of such a mounting member 3 is not particularly limited, a material with a damping property is preferably used. Thus, the unwanted vibration of the mounting member 3 can be suppressed to thereby improve the detection accuracy of the angular velocity sensors 711 through 713 and so on. As such a material as described above, there can be cited various types of damping alloys such as a magnesium alloy, an iron alloy, a copper alloy, a manganese alloy, and a Ni—Ti alloy.

Pedestal 4

The pedestal 4 is fixed to the mounting member 3 so as to block a lower opening of the mounting member 3. The method of fixing the pedestal 4 to the mounting member 3 is not particularly limited, and the fixation method of using an adhesive, for example, can be used.

Such a pedestal 4 has a plate-like shape having the thickness direction corresponding to the z-axis direction, and has a lower surface and an upper surface 41 parallel to the x-y plane. Further, the upper surface 41 constitutes the fixation surface 103 for fixing the third rigid board 23.

As shown in FIG. 2, to the fixation surface 103, there is fixed the third rigid board 23 with the reverse side mounting surface 232 facing the fixation surface 103. Thus, the angular velocity sensor 713 is fixed indirectly to the fixation surface 103 via the third rigid board 23. Since the fixation surface 103 is the plane parallel to the x-y plane as described above, in the state in which the third rigid board 23 is fixed to the fixation surface 103, the detection axis of the angular velocity sensor 713 becomes parallel to the z axis. As described above, only by fixing the third rigid board 23 to the fixation surface 103, positioning of the angular velocity sensor 713 with respect to the casing 10 can easily be performed.

Further, the pedestal 4 has a recessed section 42 opened in the fixation surface 103. The recessed section 42 is opened in a center portion of the fixation surface 103 except an edge portion thereof, and is not opened in a side surface of the pedestal 4. In other wards, the recessed section 42 has a trough shape surrounded by sidewalls in the periphery thereof.

In the condition of fixing the third rigid board 23 to the fixation surface 103, the angular velocity sensor 713 and the acceleration sensor 72 mounted on the reverse side mounting surface 232 of the third rigid board 23 are located in the recessed section 42. In other words, the recessed section 42 forms a clearance for preventing the angular velocity sensor 713 and the acceleration sensor 72 from having contact with the pedestal 4. By forming such a recessed section 42 as described above, a space of the pedestal 4 can be used effectively to thereby achieve downsizing (low-profiling, reduction in height) of the sensor device 1.

Further, the recessed section 42 is filled with an infill 9, and a gap between the pedestal 4 and the third rigid board 23 is filled with the infill 9. Thus, the third rigid board 23 (the angular velocity sensor 713, the acceleration sensor 72) and the connection sections 261, 262, and 263 extending from the third rigid board 23 are fixed, and thus the unwanted vibration can effectively be prevented from occurring in the third rigid board 23. Therefore, the detection accuracy of the sensor device 1 is improved.

As a constituent material of the infill 9, those having an insulating property are preferable. The material is not particularly limited, and there can be cited as the material, for example, polyolefin such as polyethylene, or polypropylene, ethylene-propylene copolymer, polyvinyl chloride, polystyrene, polyamide, polyimide, polycarbonate, poly-(4-methylpentene-1), ionomer, acrylic resin, polymethylmethacrylate, acrylonitrile-butadiene-styrene copolymer (ABS resin), acrylonitrile-styrene copolymer (AS resin), butadiene-styrene copolymer, polyester such as polyethylene terephthalate (PET), or polybutylene terephthalate (PBT), polyether, polyetherketone (PEK), polyether ether ketone (PEEK), polyetherimide, polyacetal (POM), polyphenylene oxide, polysulfone, polyethersulfone, polyphenylene sulfide, polyarylate, aromatic polyester (liquid crystal polymer), fluorinated resin such as polytetrafluoroethylene or polyvinylidene fluoride, epoxy resin, phenol resin, urea resin, melamine resin, silicone resin, polyurethane resin, and so on, copolymers, polymer blends, and polymer alloys having any one of these compounds as a primary constituent, and these materials can be used alone or in combination.

The constituent material of such a pedestal 4 is not particularly limited, and substantially the same materials as those of the mounting member 3 can be cited for example.

Lid Member 8

The lid member 8 is fixed to the mounting member 3 so as to block an upper opening of the mounting member 3. The method of fixing the lid member 8 to the mounting member 3 is not particularly limited, and the fixation method of using an adhesive, for example, can be used.

Such a lid member 8 as described above has a plate-like shape having the thickness direction corresponding to the z-axis direction, and has a lower surface 81 parallel to the x-y plane. The lower surface 81 constitutes the fixation surface 104 for fixing the fourth rigid board 24.

As shown in FIG. 2, to the fixation surface 104, there is fixed the fourth rigid board 24 with the reverse side mounting surface 242 facing the fixation surface 104. Since the fixation surface 104 is a plane parallel to the x-y plane as described above, the rigid board 24 fixed to the fixation surface 104 is opposed to the third rigid board 23 in the z-axis direction, and at the same time disposed in parallel to the third rigid board 23. By disposing the third and fourth rigid boards 23, 24 so as to overlap each other in the z-axis direction, downsizing of the sensor device 1 in the x-y plan view can be achieved. In addition, by making the third and fourth rigid boards 23, 24 parallel to each other, the length in the z-axis direction (the height) of the sensor device 1 can be reduced, and in this regard, downsizing of the sensor device 1 can also be achieved.

Further, the lid member 8 has a recessed section 82 opened in the fixation surface 104. The recessed section 82 is opened in a center portion of the fixation surface 104 except an edge portion thereof, and is not opened in a side surface of the lid member 8. In other wards, the recessed section 82 has a trough shape surrounded by sidewalls in the periphery thereof.

In the condition of fixing the fourth rigid board 24 to the fixation surface 104, the nonvolatile memory 77 and the direction sensor 78 mounted on the reverse side mounting surface 242 of the fourth rigid board 24 are located in the recessed section 82. In other words, the recessed section 82 forms a clearance for preventing the nonvolatile memory 77 and the direction sensor 78 from having contact with the lid member 8. By forming such a recessed section 82 as described above, a space of the lid member 8 can be used effectively, and thus downsizing (low-profiling, reduction in height) of the sensor device 1 can be achieved. It should be noted that it is also possible to fill such a recessed section 82 as described above with the infill 9 as in the case of the recessed section 42 described above.

A constituent material of such a lid member 8 is not particularly limited, and substantially the same materials as those of the mounting member 3 can be cited for example.

Hereinabove, the sensor device 1 is described in detail.

According to such a sensor device 1 as described above, since the mounting board 2 is fixed directly to the casing 10, the number of components is small, and the downsizing can be achieved accordingly. Further, since the positioning of the rigid boards 21 through 25 can be performed with ease and accuracy, excellent detection performance and reliability can be exerted.

It should be noted that when mounting the sensor device 1 on the circuit board such as a motherboard, by using two side surfaces 4a, 4b of the pedestal 4 perpendicular to each other as the reference, it is possible to easily point the detection axes of the angular velocity sensors 711, 712 to the desired directions. Specifically, the side surface 4a is a plane parallel to the detection axis of the angular velocity sensor 712, and the side surface 4b is a plane parallel to the detection axis of the angular velocity sensor 711. Therefore, by performing the positioning with respect to the circuit board using the side surfaces 4a, 4b as the reference, it is possible to point the detection axes of the angular velocity sensors 711, 712 to the desired directions with ease and accuracy.

Second Embodiment

Then, a sensor device according to a second embodiment of the invention will be explained.

Figure 5:
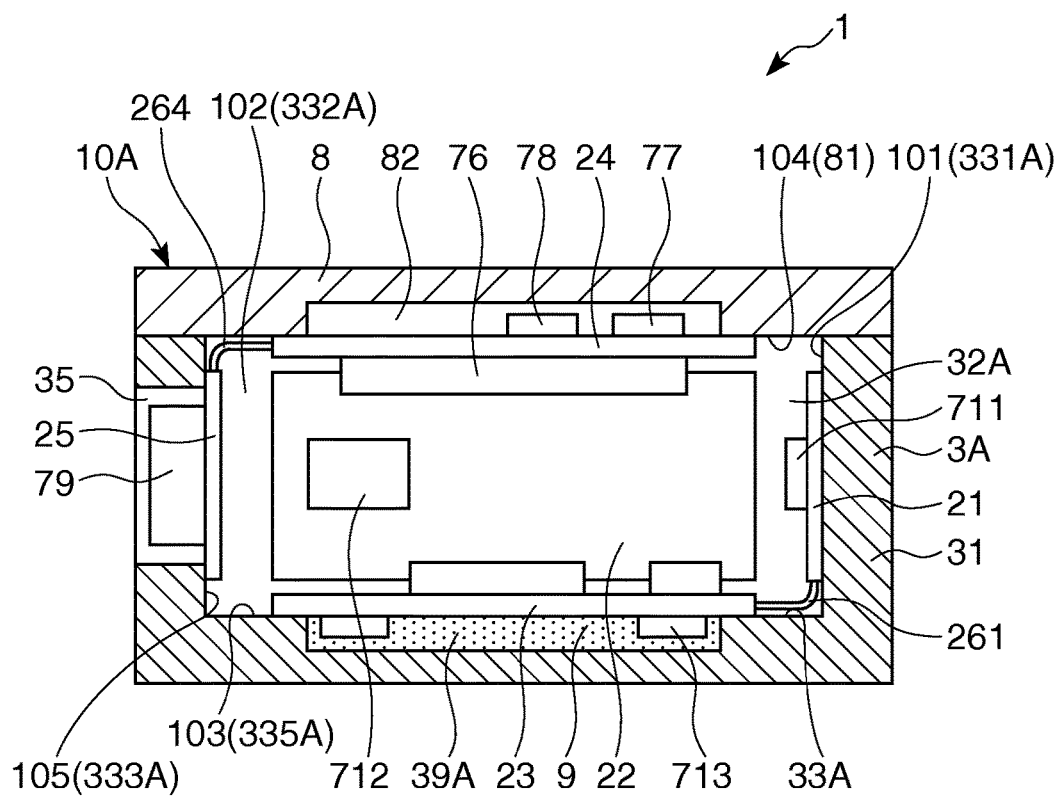
FIG. 5 is a cross-sectional view showing a sensor device according to a second embodiment of the invention.
Figure 5:
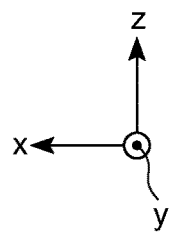

FIG. 5 is a cross-sectional view showing the sensor device according to the second embodiment of the invention.

Hereinafter, the second embodiment will be described with a focus mainly on differences from the first embodiment described above, and explanations regarding substantially the same matters will be omitted. The sensor device according to the present embodiment is substantially the same as the sensor device according to the first embodiment except that the configuration of the casing is different. It should be noted that the constituents identical to those of the first embodiment described above are denoted by the same reference symbols.

As shown in FIG. 5, a casing 10A provided to the sensor device 1 according to the present embodiment has a mounting member 3A and the lid member 8. In other words, in the present embodiment, the pedestal 4 of the first embodiment described above is formed integrally with the mounting member 3.

The mounting member 3A has a main body 31A, and a recessed section 32A opened in an upper surface of the main body 31A. A space in the recessed section 32A functions as a housing space for housing the electronic components 7. The recessed section 32A has a rectangular lateral cross-sectional shape.

An inner surface 33A exposed to the recessed section 32A is composed of a pair of planes 331A, 333A parallel to the y-z plane, a pair of planes 332A, 334A parallel to the x-z plane, and a plane 335A parallel to the x-y plane. Among these five planes 331A through 335A, the plane 331A constitutes the fixation surface 101, the plane 332A constitutes the fixation surface 102, the plane 333A constitutes the fixation surface 105, and the plane 335A constitutes the fixation surface 103.

To the fixation surface 101, there is fixed the first rigid board 21 with a reverse side mounting surface 212 facing the fixation surface 101. Thus, the detection axis of the angular velocity sensor 711 becomes parallel to the x axis.

To the fixation surface 102, there is fixed the second rigid board 22 with the reverse side mounting surface 222 facing the fixation surface 102. Thus, the detection axis of the angular velocity sensor 712 becomes parallel to the y axis.

To the fixation surface 103, there is fixed the third rigid board 23 with the reverse side mounting surface 232 facing the fixation surface 103. Thus, the detection axis of the angular velocity sensor 713 becomes parallel to the z axis. Further, the mounting member 3A has a recessed section 39A opened in the fixation surface 103. The recessed section 39A is opened at a center portion of the fixation surface 103 except an edge portion thereof, and in the condition of fixing the third rigid board 23 to the fixation surface 103, the angular velocity sensor 713 and the acceleration sensor 72 are located in the recessed section 39A. Further, the recessed section 39A is filled with the infill 9.

To the fixation surface 105, there is fixed the fifth rigid board 25 with the reverse side mounting surface 252 facing the fixation surface 105. Further, the mounting member 3A is provided with the through hole 35 penetrating the fixation surface 105 and the outer peripheral surface, and the fifth rigid board 25 is fixed to the fixation surface 105 with the connector 79 inserted in the through hole 35.

According also to the second embodiment described hereinabove, substantially the same advantage as in the first embodiment described above can be obtained.

Third Embodiment

Then, a sensor device according to a third embodiment of the invention will be explained.

Figure 6:
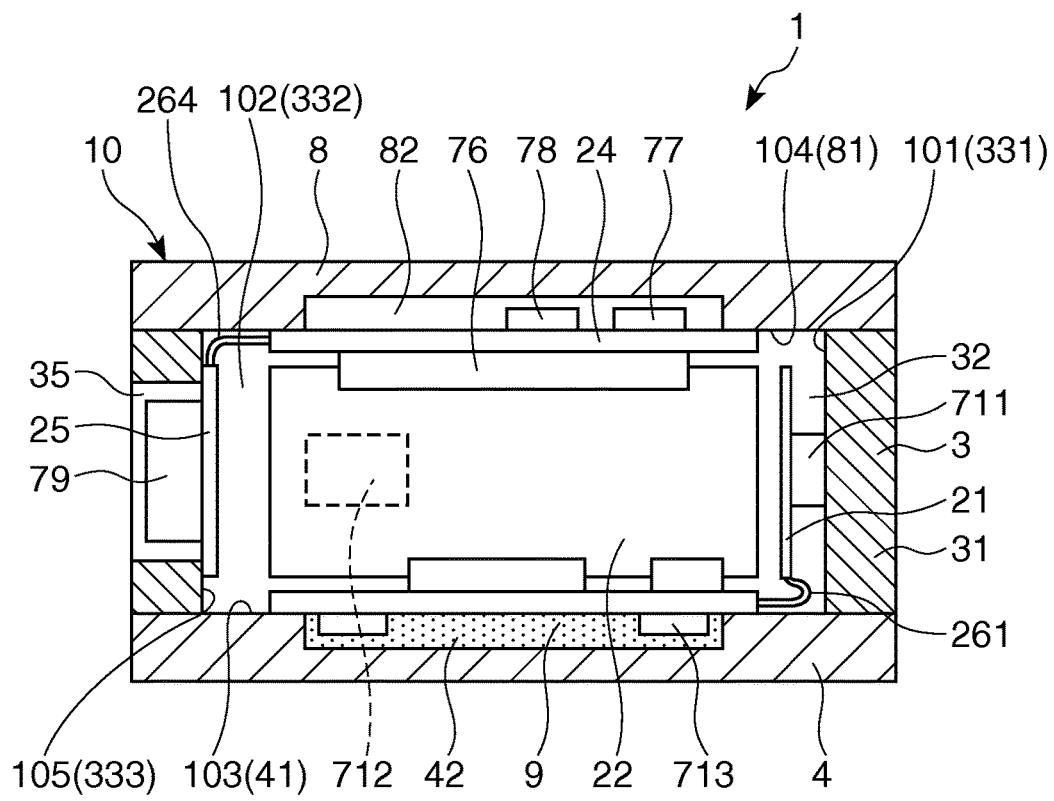
FIG. 6 is a cross-sectional view of a sensor device according to a third embodiment of the invention.
Figure 7A:
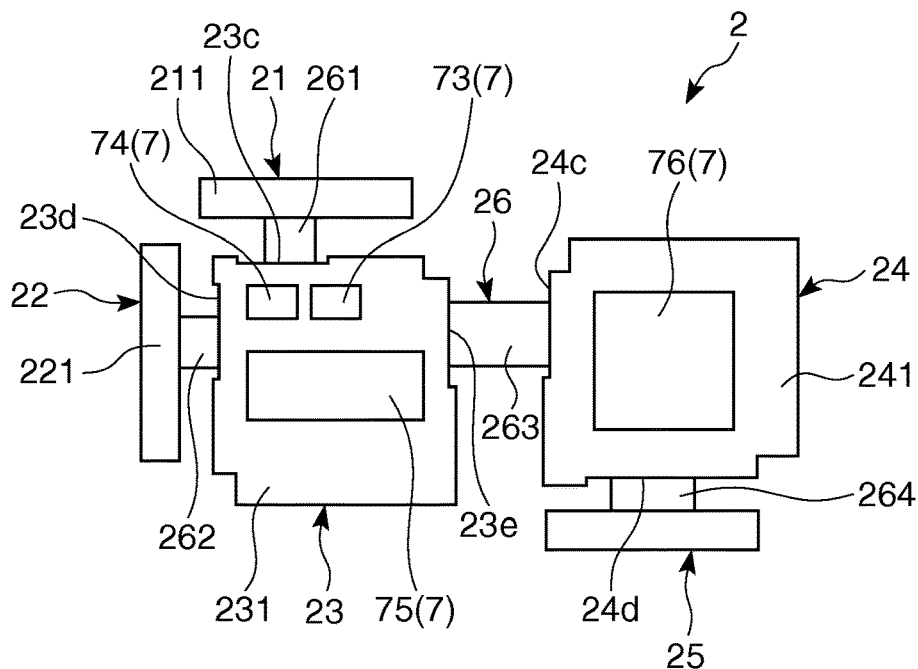
FIGS. 7A and 7B are development diagrams of a mounting board provided to the sensor device shown in FIG. 6.
Figure 7B:
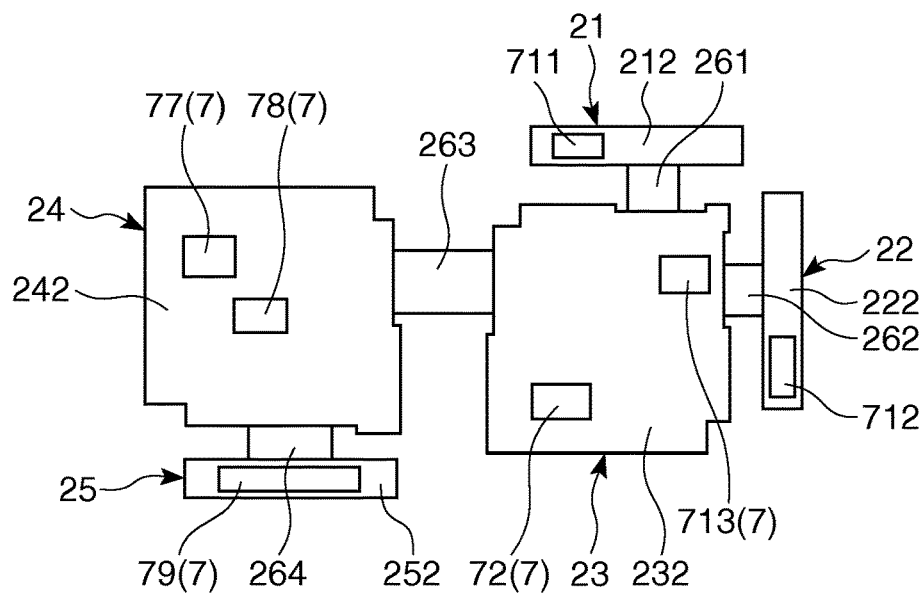
Figure 8:
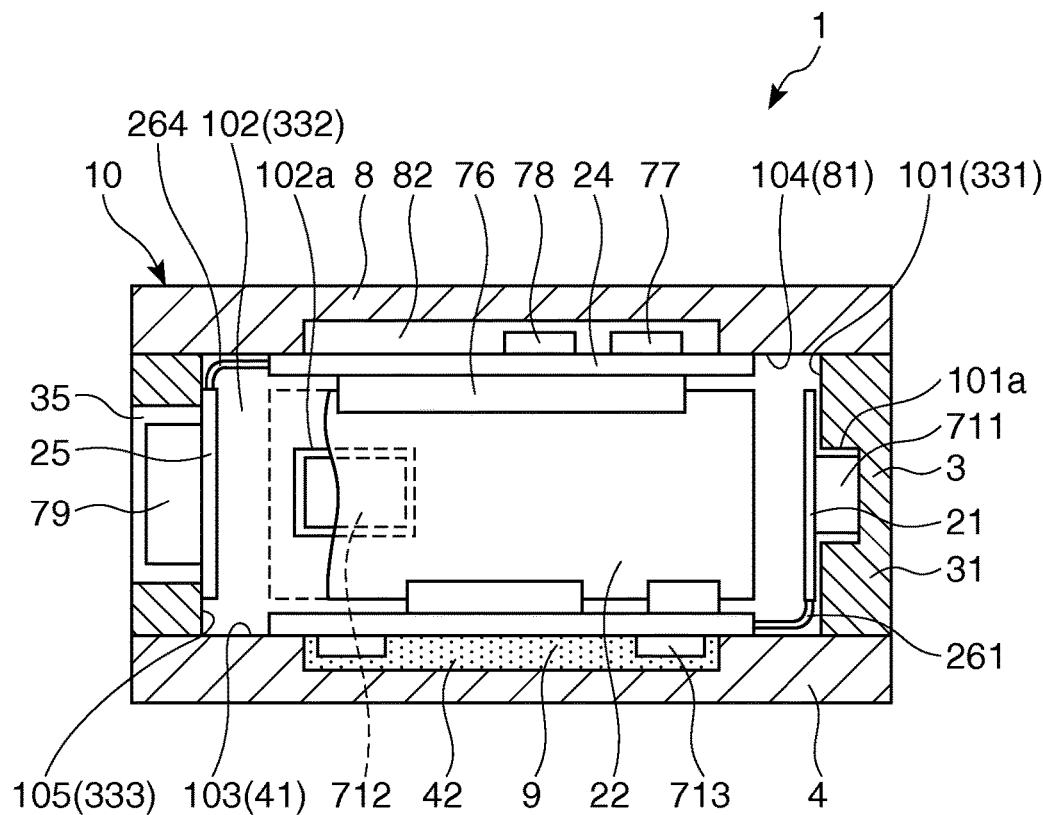
FIG. 8 is a cross-sectional view showing a modified example of the sensor device shown in FIG. 6.
Figure 8:
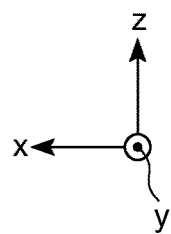

FIG. 6 is a cross-sectional view of the sensor device according to the third embodiment of the invention, FIGS. 7A and 7B are development diagrams of a mounting board provided to the sensor device shown in FIG. 6, and FIG. 8 is a cross-sectional view showing a modified example of the sensor device shown in FIG. 6.

Hereinafter, the third embodiment will be described with a focus mainly on differences from the embodiments described above, and explanations regarding substantially the same matters will be omitted.

The sensor device according to the present embodiment is substantially the same as the sensor device according to the first embodiment except that mounting positions of the angular velocity sensors with respect to the mounting board 2 are different. It should be noted that the constituents identical to those of the first embodiment described above are denoted by the same reference symbols.

As shown in FIGS. 7A and 7B, in the mounting board 2 according to the present embodiment, the angular velocity sensor 711 is mounted on the reverse side mounting surface 212 of the first rigid board 21, and the angular velocity sensor 712 is mounted on the reverse side mounting surface 222 of the second rigid board 22.

Further, as shown in FIG. 6, the first mounting board 21 is fixed to the fixation surface 101 with the angular velocity sensor 711 located on the fixation surface 101 side and directly fixed to the fixation surface 101 with an adhesive or the like. Similarly, the second mounting board 22 is fixed to the fixation surface 102 with the angular velocity sensor 712 located on the fixation surface 102 side and directly fixed to the fixation surface 102 with an adhesive or the like.

It should be noted that as a modified example of the present embodiment, as shown in FIG. 8, it is also possible for the fixation surface 101 to have a recessed section 101a at a position corresponding to the angular velocity sensor 711, and house a part of the angular velocity sensor 711 in the recessed section 101a. The depth of the recessed section 101a is set to be slightly smaller than the thickness of the angular velocity sensor 711 in order for preventing the first mounting board 21 and the fixation surface 101 from having contact with each other.

Similarly, it is also possible for the fixation surface 102 to have a recessed section 102a at a position corresponding to the angular velocity sensor 712, and house a part of the angular velocity sensor 712 in the recessed section 102a. The depth of the recessed section 102a is set to be slightly smaller than the thickness of the angular velocity sensor 712 in order for preventing the second mounting board 22 and the fixation surface 102 from having contact with each other.

By providing the recessed sections 101a, 102a to the fixation surfaces 101, 102 as described above, the space of the mounting member 3 can effectively be used, and the downsizing of the sensor device 1 can be achieved.

According also to the third embodiment described hereinabove, substantially the same advantage as in the first embodiment described above can be obtained.

2. Electronic Apparatus

Figure 9:
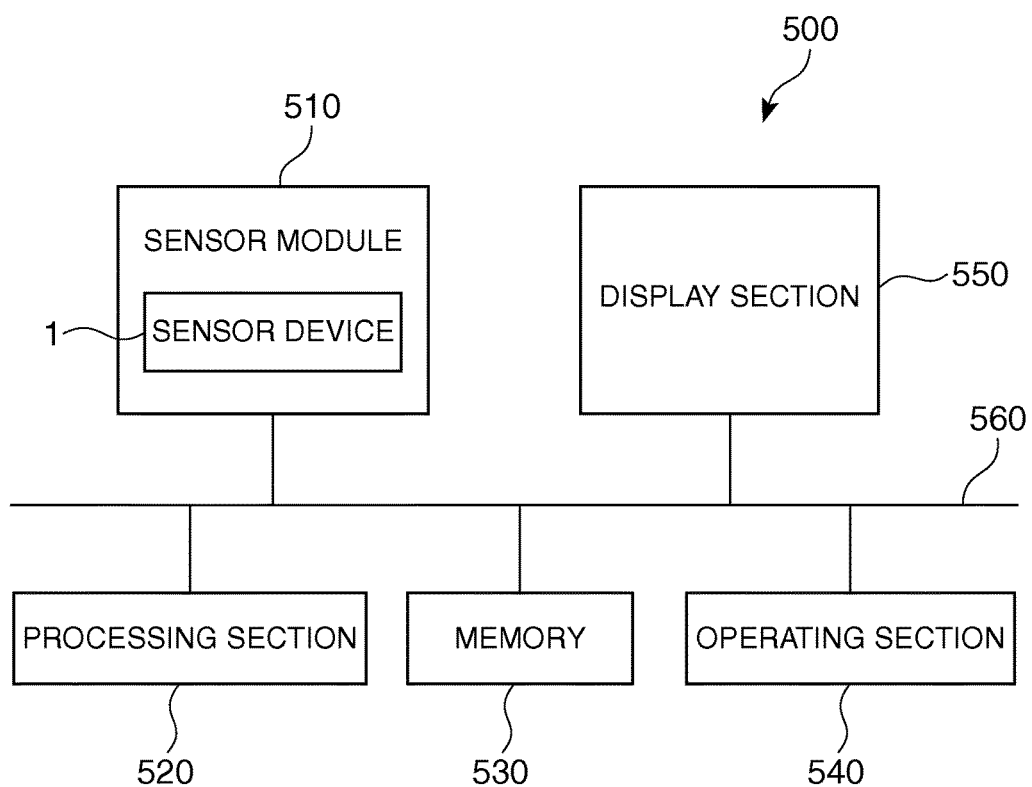
FIG. 9 is a diagram showing an example of a configuration of an electronic apparatus equipped with the sensor device according to the invention.

The sensor device 1 described above can be incorporated in a variety of electronic apparatuses. The electronic apparatus according to an embodiment of the invention equipped with the sensor device 1 will hereinafter be described. FIG. 9 is a diagram showing an example of a configuration of an electronic apparatus 500 equipped with the sensor device 1. The electronic apparatus 500 is not particularly limited, and there can be cited as the electronic apparatus, for example, a digital camera, a video camera, a car navigation system, a cellular phone, a mobile PC, a robot, a gaming machine, and a gaming controller.

The electronic apparatus 500 shown in FIG. 9 has a sensor module 510 including the sensor device 1, a processing section 520, a memory 530, an operating section 540, and a display section 550. These constituents are connected to each other via a bus 560. The processing section (e.g., a CPU and an MPU) 520 performs control of the sensor module 510 and so on and the overall control of the electronic apparatus 500. Further, the processing section 520 performs a process based on angular velocity information detected by the sensor module 510. For example, the processing section 520 performs a process for blurring correction, posture control, and GPS autonomous navigation based on the angular velocity information. The memory 530 stores a control program and a variety of data, and further, functions as a working area and a data storage area. The operating section 540 is for a user to operate the electronic apparatus 500. The display section 550 is for displaying a variety of information to the user.

Although the sensor device and the electronic apparatus according to the invention are hereinabove described based on the embodiments shown in the accompanying drawings, the invention is not limited thereto, but the configuration of each of the constituents can be replaced with one having an arbitrary configuration with an equivalent function.

Further, although in the embodiments described above there is explained the configuration of mounting the three angular velocity sensors on the mounting board, the number of angular velocity sensors is not limited thereto, and can be one or two. Further, the number of rigid boards can also be changed in accordance with the number of angular velocity sensors.

Further, although in the embodiments described above the mounting board is formed of the rigid-flexible board, the configuration of the mounting board is not limited thereto, and it is also possible to configure the mounting board with a plurality of rigid boards not connected to each other. In this case, it is possible to electrically connect the rigid boards to each other using connectors and so on after fixing the rigid boards to the mounting member.

Further, although in the embodiments described above the configuration of fixing the electronic components mounted on the mounting board to the casing is explained, the configuration is not limited thereto, and it is also possible to eliminate the mounting board, and directly fix the electronic components to the casing. In this case, it is possible to separately form wires or the like for electrically connecting the electronic components to each other.

What is claimed is:

1. A sensor device comprising:
a housing member having first through sixth walls and an inside space enclosed by the first through sixth walls;
a through-hole provided in the first wall of the housing member;
a first board provided on an inner surface of the first wall so as to cover an opening of the through-hole;
second, third, and fourth boards respectively provided on inner surfaces of the second, third, and fourth walls;
a connector provided at the first board so as to be exposed to an outside of the sensor device through the through-hole; and
first through third sensor components respectively provided on the second, third, and fourth boards, wherein the first through third sensor components respectively have first through third detection axes intersecting with each other
the connector outputs a signal from the first sensor component, a signal from the second sensor component, and a signal from the third sensor component, and
wherein the second wall has a first recess that is open toward the second board, and
the first sensor component is housed in the first recess so that the first sensor component is located between the second wall and the second board, and
a depth of the first recess is larger than a thickness of the first sensor component.

2. The sensor device according to claim 1, wherein
the third wall has a second recess opened toward the third board, and
the second sensor component is housed in the second recess so that the second sensor component is located between the third wall and the third board.

3. The sensor device according to claim 2, wherein:
four of the first through sixth walls define side walls of the sensor device,
remaining two of the first through sixth walls define upper and bottom lids of the sensor device, and
the housing member is in a rectangular parallelepiped shape.

4. The sensor device according to claim 2, wherein:
five of the first through sixth walls define a main body of the sensor device,
a remaining one of the first through sixth walls defines a lid of the sensor device, and
the housing member is in a rectangular parallelepiped shape.

5. The sensor device according to claim 1, wherein
the first through third sensor components are angular velocity sensors.

6. The sensor device according to claim 1, wherein
the first through third sensor components are acceleration sensors.

7. An electronic apparatus comprising:
the sensor device according to claim 1.

8. The sensor device according to claim 1, wherein
a depth of the second recess is smaller than a thickness of the second sensor component.

* * * * *